(12) United States Patent
Werner et al.

(10) Patent No.: US 11,695,240 B2
(45) Date of Patent: Jul. 4, 2023

(54) RETRACTABLE EMC PROTECTION

(71) Applicant: INTERNATIONAL BUSINESS MACHINES CORPORATION

(72) Inventors: John S. Werner, Fishkill, NY (US); Noah Singer, White Plains, NY (US); Samuel R. Connor, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/451,830

(22) Filed: Oct. 22, 2021

(65) Prior Publication Data

US 2023/0131691 A1  Apr. 27, 2023

(51) Int. Cl.
*H01R 13/6582* (2011.01)
*H01R 13/17* (2006.01)
*H01R 13/627* (2006.01)

(52) U.S. Cl.
CPC ......... *H01R 13/6582* (2013.01); *H01R 13/17* (2013.01); *H01R 13/6272* (2013.01); *H01R 2201/06* (2013.01)

(58) Field of Classification Search
CPC  H01R 13/6582; H01R 13/17; H01R 13/6272; H01R 2201/06; H05K 9/00
See application file for complete search history.

(56) References Cited

U.S. PATENT DOCUMENTS

| 3,518,355 A | 6/1970 | Luce |
| 3,783,429 A | 1/1974 | Otte |
| 5,091,823 A | 2/1992 | Kanbara |
| 5,092,781 A | 3/1992 | Casciotti |
| 5,483,423 A | 1/1996 | Lewis |
| 5,563,390 A | 10/1996 | Demissy |

(Continued)

FOREIGN PATENT DOCUMENTS

| CN | 112492864 A | 3/2021 |
| DE | 102010031035 B3 | 1/2012 |

(Continued)

OTHER PUBLICATIONS

List of IBM Patents or Patent Applications Treated as Related.
Notice of References Cited, U.S. Appl. No. 17/451,833, dated May 4, 2023.

*Primary Examiner* — Gary F Paumen
(74) *Attorney, Agent, or Firm* — Nathan M. Rau

(57) ABSTRACT

A system and method for providing electromagnetic compatibility (EMC) protection for a removable component through a retractable EMC protection apparatus. The EMC protection apparatus includes an actuation pin, a stabilizing bracket, an actuation arm, a spring brace, an arm spring, a second stabilizing bracket, a rounded pin, an angled engagement feature, an enclosure opening, a conductive surface, a protection device spring, and a retractable EMC protection device. The actuation pin is configured to engage upon a surface of an end product upon insertion of the removable component into the end product. The activation arm is configured to simultaneously compress the arm spring against the stop brace and to push on the angled engagement feature. The angled engagement feature is configured to push in a downward direction on the conductive surface to seal an enclosure opening of the removable component with the retractable EMC protection device.

20 Claims, 4 Drawing Sheets

(56) References Cited

U.S. PATENT DOCUMENTS

| | | | |
|---|---|---|---|
| 5,637,001 A | 6/1997 | Nony | |
| 6,396,382 B1 | 5/2002 | Ross | |
| 6,501,019 B2 | 12/2002 | Sato | |
| 6,709,286 B1 | 3/2004 | Korsunsky | |
| 6,794,571 B1 | 9/2004 | Barringer | |
| 6,870,093 B2 | 3/2005 | King Jr. | |
| 6,924,988 B2 * | 8/2005 | Barringer | H05K 9/0062 174/383 |
| 6,930,892 B2 * | 8/2005 | Barringer | H05K 5/0295 361/740 |
| 7,081,587 B1 | 7/2006 | Woolsey | |
| 7,215,536 B2 | 5/2007 | Hensley | |
| 7,532,469 B2 | 5/2009 | Frank | |
| 7,683,267 B2 * | 3/2010 | Peets | H05K 9/0062 174/355 |
| 7,837,503 B2 | 11/2010 | Hartzell | |
| 7,881,052 B2 * | 2/2011 | Crippen | G11B 33/122 361/725 |
| 7,997,906 B2 | 8/2011 | Ligtenberg | |
| 8,638,570 B2 | 1/2014 | Liu | |
| 9,054,804 B2 | 6/2015 | McColloch | |
| 9,200,709 B2 | 12/2015 | Eidem | |
| 10,477,740 B2 | 11/2019 | Coppola | |
| 10,575,448 B1 | 2/2020 | Lewis | |
| 10,642,327 B1 | 5/2020 | Silvanto | |
| 2006/0261710 A1 | 11/2006 | Frank | |
| 2006/0262512 A1 | 11/2006 | Klein | |
| 2007/0007037 A1 | 1/2007 | Diaferia | |
| 2007/0071575 A1 | 3/2007 | Rudduck | |
| 2007/0114060 A1 | 5/2007 | Barringer | |
| 2015/0070840 A1 | 3/2015 | Rappoport | |
| 2019/0040675 A1 | 2/2019 | Alexander | |

FOREIGN PATENT DOCUMENTS

| | | |
|---|---|---|
| EP | 0665564 B1 | 1/1998 |
| JP | 2001168572 A | 6/2001 |
| JP | 2004207722 A | 7/2004 |

\* cited by examiner

RETRACTABLE EMC PROTECTION

BACKGROUND

The present disclosure relates to electromagnetic compatibility protection, and more specifically, to a retractable EMC protection apparatus for a removeable component.

For enclosures such as servers, IO drawers, and processor drawers that are densely packed and have removable components such as power supplies and IO cards it is difficult to add EMI/EMC protection due to the space restrictions on either the removable component or the enclosure. Further, due to the tight space there is a high risk of damaging the protection during plug in or plug out events.

SUMMARY

According to embodiments of the present disclosure a retractable electromagnetic compatibility (EMC) protection apparatus for a removable component is disclosed. The retractable EMC apparatus includes an actuation arm, an actuation pin connected to a first end of the actuation arm, an arm spring connected to the actuation pin, and a stop brace connected to the removable component, the actuation arm continuing through the strop brace, the stop brace configured to cause the arm spring to compress during insertion of the removable component. The retractable EMC apparatus also includes a movable conductive surface, an angled engagement feature on a first side of the movable conductive surface and in contact with a second end of the actuation arm, and a retractable EMC protection device connected to the movable conductive surface on a second side of the moveable conductive surface. The actuation pin is configured to engage upon a surface of an end product upon insertion of the removable component into the end product. The activation arm is configured to simultaneously compress the arm spring against the stop brace and to push on the angled engagement feature. The angled engagement feature is configured to push in a downward direction on the conductive surface to seal an enclosure opening of the removable component with the retractable EMC protection device.

According to embodiments of the present disclosure a method of providing electromagnetic compatibility (EMC) protection is disclosed. The method begins by inserting a removable component into an end product where the removable component includes a retractable EMC protection apparatus. Prior to completing the insertion of the removable component, a surface of the end product is contacted by an actuation pin of the retractable EMC protection apparatus. This causes an arm spring on an actuation arm to compress and also causes the actuation arm to push on an angled engagement feature of the EMC protection feature at the same time. This pushing causes an EMC protection device to seal an enclosure opening in the removable component.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
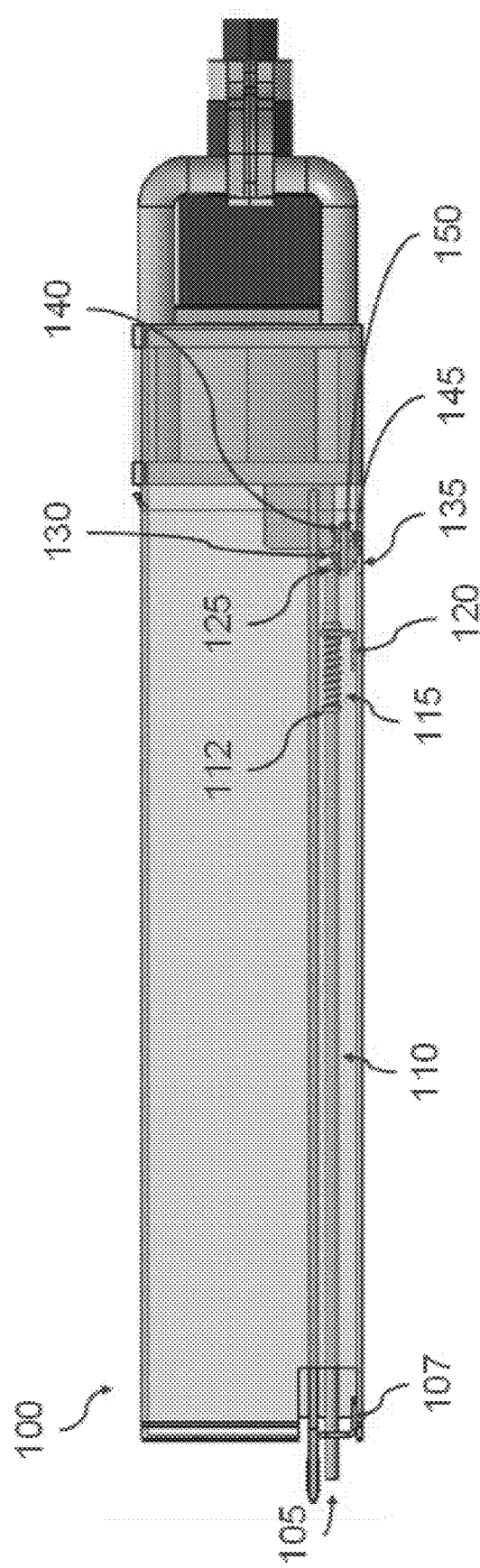
FIG. 1 is a diagrammatic illustration of a removable component according to embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to electromagnetic compatibility protection, more particular aspects relate to a retractable EMC protection apparatus for a removeable component. While the present disclosure is not necessarily limited to such applications, various aspects of the disclosure may be appreciated through a discussion of various examples using this context.

Enclosures such as servers IO draws, processor drawers, etc. are often densely packed with components. Some of these components are removable components, such as power supplies or IO cards. Due to space restrictions on either the removable component or the enclosure it can be difficult to add electromagnetic interference (EMI)/electromagnetic compatibility (EMC) protection (e.g., gaskets, EMI springs, electrical noise absorbers) to the system. Often, if EMC protection is added in tight areas, problems such as shearing of a gasket during a plug/unplug event or high plug force can occur. However, if EMC protection is not used, there is a high potential for radiated emissions leakage, lack of immunity, and/or high ESD susceptibility through the unprotected slot. As speeds increase and higher frequency content is introduced, there is higher chance that this could lead to the associated product failing EMC certification tests.

The present disclosure provides a solution to the above identified issues related to the removable components and the needed EMI/EMC protection. The present disclosure provides an apparatus wherein EMC gaskets and/or springs are retracted into a removable component on one or more sides that provides a low plug force and prevents shearing during a plug/unplug event. When nearing the end of a plugging action, the apparatus engages a pin that extends the EMC gaskets and/or springs to adequately seal openings around the removable components to minimize radiated emissions leakage, increase immunity, and/or lower ESD susceptibility of the plugged component and the end product into which the removable component is inserted. In some embodiments, the apparatus may be implanted on the removable component or on the enclosure side where the removable component inserts. In other embodiments, the insertion of a cable connector engages a pin that extends the EMC gaskets and/or springs.

FIG. 1 is a diagrammatic illustration of a removable component 100 according to embodiments of the present disclosure. In FIG. 1 the removable component 100 is illustrated as a power supply unit (PSU). However, it could be any other type of removable component such as an input/output card, fan assembly, etc. Removable component 100 includes an actuation pin 105, a stabilizing bracket 107, an actuation arm 110, a spring brace 112, an arm spring 115, a second stabilizing bracket 120, a rounded pin 125, an angled engagement feature 130, an enclosure opening 135, a conductive surface 140, a protection device spring 145, and a retractable EMC protection device 150 (which includes an EMI gasket).

Figure 2:
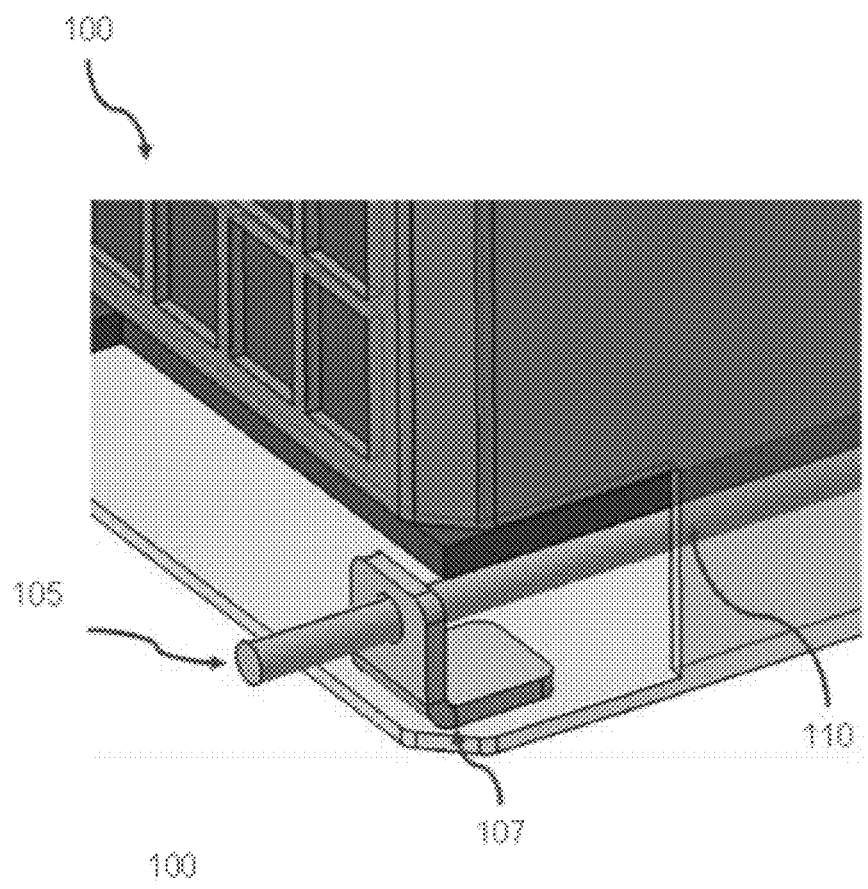
FIG. 2 is an orthogonal view of the rear of the removable component according to embodiments of the present disclosure.

FIG. 2 is an orthogonal view of the rear of the removable component 100 according to embodiments of the present disclosure. This view illustrates the actuation pin 105, the stabilizing bracket 107 and the actuation arm 110. The actuation pin 105 is engaged as a user plugs in the removable component 100 by hitting the back wall of a cubby or other feature implemented on an end product that the removable component 100 is inserted into. The length of the actuation pin 105 can be adjusted such that activation of the gasket can happen whenever it is desired by the component designer such as before, during, or after connector engagement.

As removable component 100 nears the end of its plugging action (e.g., the PSU 100 is 1 cm from being fully inserted into the end product), actuation pin 105 will make contact with a feature of the end product (e.g., back wall of the cubby where the PSU sits, not illustrated) and begin to compress. That is, the actuator pin 105 will move inward towards the retractable EMC protection device 150. The stabilizing bracket 107 ensures that actuation pin 105 does not wobble and stays in line with the contact feature of the end product. The actuation arm 110 is connected to actuation pin 105 and extends through the removable component 100 to the rounded pin 125

Figure 3:
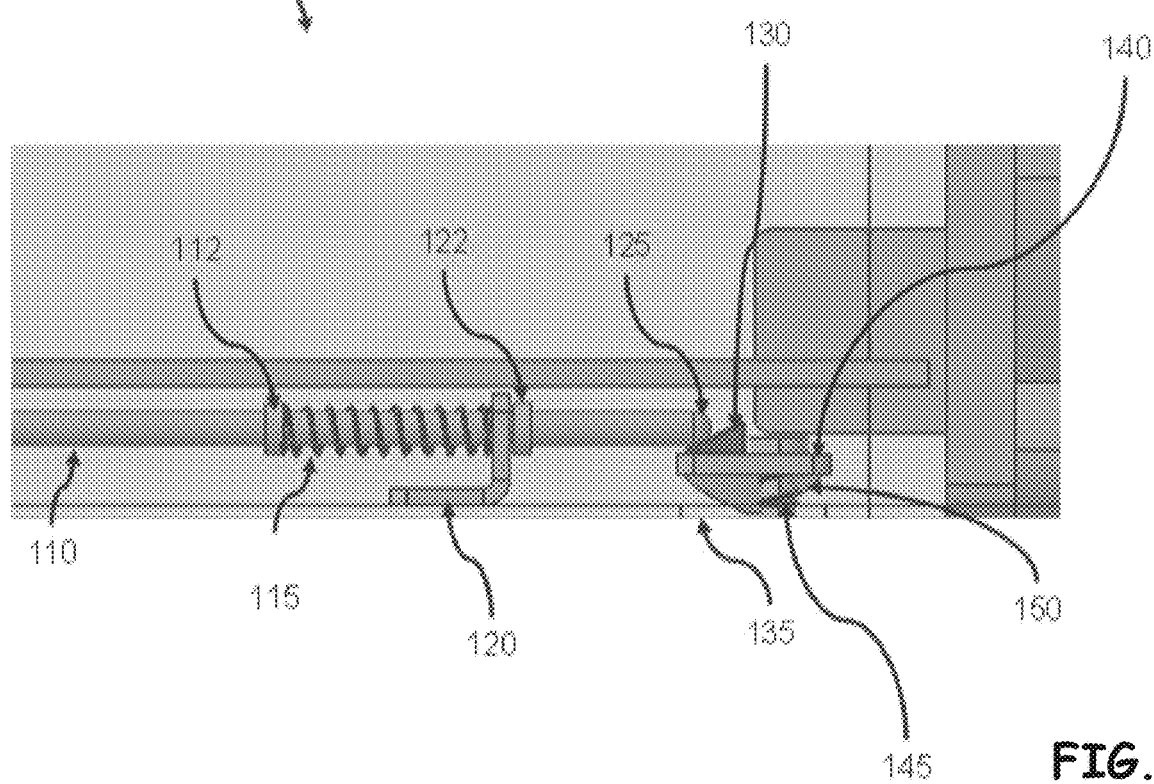
FIG. 3 is a side view of the removable component illustrating an enlarged view of the actuation arm at the end of the component where the retractable EMC protection device and the rounded pin are located according to embodiments of the present disclosure.

FIG. 3 is a side view of the removable component illustrating an enlarged view of the actuation arm at the end of the component where the retractable EMC protection device and the rounded pin are located according to illustrative embodiments. In FIG. 3, the spring brace 112 is rigidly attached to actuation arm 110. The arm spring 115 is located between the spring brace 112 and the stabilizing bracket 120. The arm spring 115 is extended in its relaxed state which causes the actuation pin 105 to stick out the rear portion of the removable component 100. When the removable component 100 is inserted into an end product, the actuation pin 105 will be engaged inward, which in turn moves the actuation arm 110 and the spring brace 112 inward. This compresses the arm spring 115 towards the stabilizing bracket 120. The stabilizing bracket 120 is rigidly mounted within the removable component 100 (e.g., to an enclosure wall) and prevents the actuation arm 110 from wobbling in addition to acting as a brace when the arm spring 115 is compressed. The stop brace 122 rests up against the stabilizing bracket 120 when the removable component 100 is not inserted into an end product. This feature prevents the arm spring 115 from expanding too far which ensures that the actuation pin 105 always sticks out the rear of removable component 100 by a consistent length.

Figure 4:
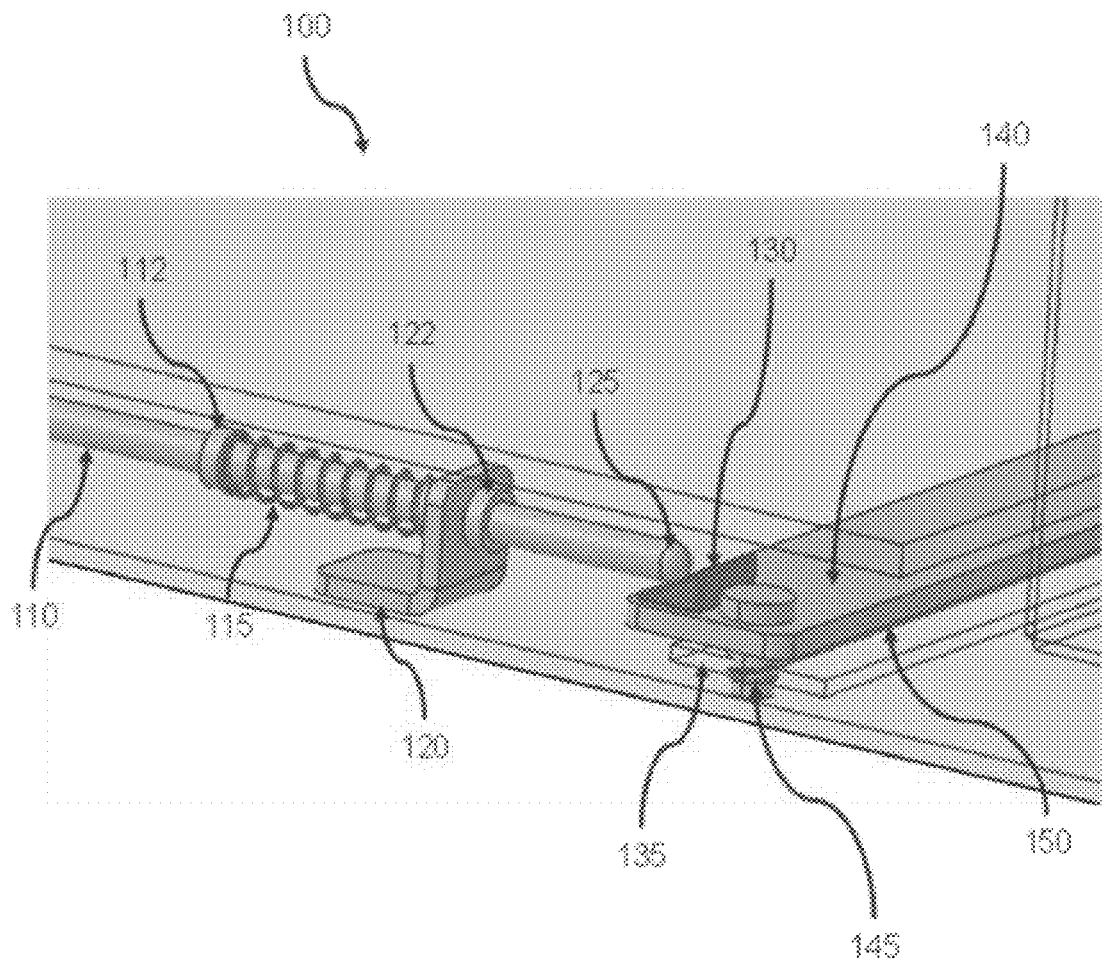
FIG. 4 is an orthogonal view of the removable component illustrating an enlarged view of the actuation arm at the end of the component where the retractable EMC protection device and the rounded pin are located according to embodiments of the present disclosure.

FIG. 4 is an orthogonal view of the removable component illustrating an enlarged view of the actuation arm at the end of the component where the retractable EMC protection device and the rounded pin are located according to embodiments. The rounded pin 125 is located at the end of the actuation arm 110 and pushes up against the angled engagement feature 130 when the removable component 100 is inserted into an end product The angled engagement feature 130 is rigidly attached to a top portion of the conductive surface 140; when the rounded pin 125 moves towards engagement feature 130, rounded pin 125 pushes against the angled engagement feature 130. This occurs upon insertion of removable component 100 into an end product. At this point the conductive surface 140 is pushed downward towards the enclosure opening 135.

The enclosure opening 135 is an open slot on the exterior of the removable component 100 that is closed off by the retractable EMC protection device 150 when the component 100 is inserted into an end product. The use of the enclosure opening is in contrast to normal approaches as openings are problematic and considered bad when designing for good EMC protection. In order to maintain good EMC protection the present disclosure ensures that there is proper sealing of the enclosure opening 135. How this sealing is obtained is discussed in greater detail with respect to FIG. 5.

The conductive surface 140 has one or more angled engagement features 135 on the top surface and the EMC protection device 150 on the bottom surface. The conductive surface 140 also contains one or more protection device springs 145 which permit the conductive surface 140 to move up and down when removable component 100 is inserted or removed from an end product. The conductive surface 140 can be made from (or have an exterior coating) a material that is electrically conductive (e.g., metal, conductive paint). The conductive surface 140 is at ground potential with the rest of removable component's enclosure.

The protection device spring 145 is located between the conductive surface 140 and a rigid surface within removable component 100 (e.g., an enclosure wall). The protection device spring 145 is extended in its relaxed state which causes the conductive surface 140 to stay up and remain completely contained within the removable component 100 such that the retractable EMC protection device 150 is not sticking out through enclosure opening 135.

When the removable component 100 is inserted into an end product, the actuation pin 105 is engaged inward, which in turn pushes the conductive surface 140 downward. This downward movement compresses the protection device spring 145 towards the enclosure opening 135. The retractable EMC protection device 150 then lowers when the removable component 100 is inserted into an end product to provide adequate sealing on all sides of the enclosure opening 135 (illustrated as 505 in FIG. 5) and sticks out far enough to compress against another surface (either the end product or a second removable component 100) and seals off the enclosure opening 135 to obtain good EMC containment.

As the retractable EMC protection device 150 begins engagement and before the removable component 100 is fully inserted into the end product, the EMC protection device 150 is able to wipe against the neighboring surface. (i.e., inserted more than 90% of the way into the end product). The wiping action between an EMI gasket of the EMC protection device 150 and the mating metal surface (e.g., metal of enclosure opening 135) helps to cut through any anti-fingerprint coatings or oxidation that are present on the metal surface that would prevent making a good, low-resistance electrical connection. The retractable EMC protection device 150 is sized and placed such that when it is inserted into the enclosure opening 135 the gasket is as close to the external surface of the removable component 100 as is possible. This is obtained by compressing the EMC protection device into the enclosure opening 135 and contacting a component outside of the removeable component. In some embodiments this compression results in the EMC protection device 150 being compressed between 30 and 70 percent of its original height. (i.e., height prior to insertion). In some embodiments the EMC protection device 150 has a bell or other curved shape such that the curve extends towards or into the enclosure opening. However, any shape can be used for the EMC protection device so long as it can completely seal the enclosure opening. By not engaging the EMC protection device 150 prior to the insertion of the removable component 100 into the end product, a lower plug force is obtained than would be possible using traditional methods.

Figure 5A:
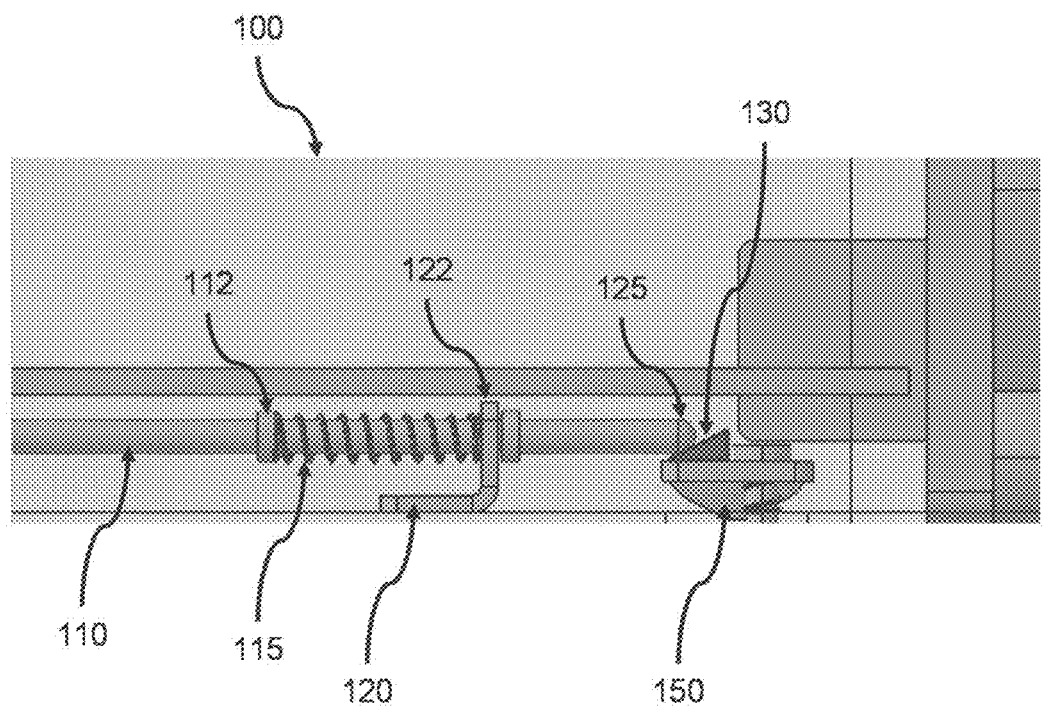
FIG. 5A is a side view illustrating the EMC protection device in the open position according to embodiments of the present disclosure.
Figure 5B:
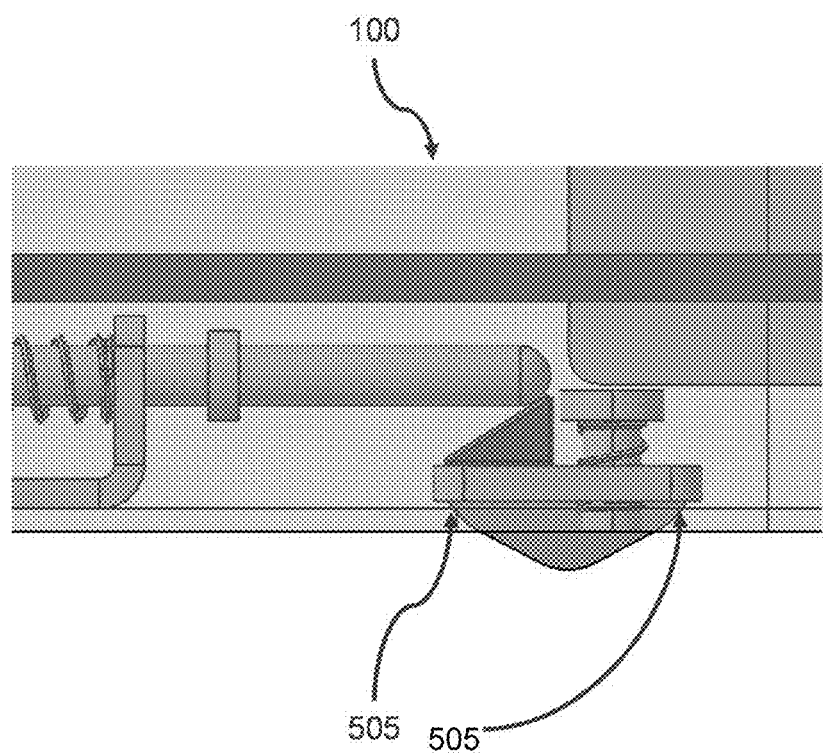
FIG. 5B is a side view illustrating the EMC protection device in the closed or sealed position according to embodiments of the present disclosure.

FIG. 5A is a side view illustrating the EMC protection device in the open position. FIG. 5B is a side view illustrating the EMC protection device in the closed or sealed position. As illustrated in FIG. 5B, the rounded pin 125 of the actuation arm 110 has pushed against the angled engagement feature 130 to cause the conductive surface 140 and the EMC protection device 150 to move towards the enclosure opening 135. As the EMC protection device 150 engages with the enclosure opening, it forms a seal around the opening 135 and extends far enough through enclosure opening 135 to compress against an end product or another removable component 100.

While the present disclosure only discusses a single actuation arm 110 and associated features for engaging the EMC protection device 150, it should be understood that two or more of the actuation arms 110 can be present. The multiple actuation arms 110 each push on a corresponding angled engagement feature 130 located on the conductive surface 140. This enables the pressure on the EMC protection device 150 to be more even across the entire length than when a single actuation arm is used. This also enables a stronger or more consistent sealing as well.

While the present disclosure only discusses EMC sealing on a single side of the removable component 100, it should be understood that the components could be replicated on one or more sides of removable component 100 to obtain a full 360 degree EMC seal.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A retractable electromagnetic compatibility (EMC) protection apparatus for a removable component comprising:
   an actuation arm;
   an actuation pin connected to a first end of the actuation arm;
   an arm spring connected to the actuation pin;
   a stop brace connected to the removable component, the actuation arm continuing through the strop brace, the stop brace configured to cause the arm spring to compress during insertion of the removable component;
   a movable conductive surface;
   an angled engagement feature on a first side of the movable conductive surface configured to contact with a second end of the actuation arm; and
   a retractable EMC protection device connected to the movable conductive surface on a second side of the moveable conductive surface;
   wherein the actuation pin is configured to engage upon a surface of an end product upon insertion of the removable component into the end product;
   wherein the activation arm is configured to simultaneously compress the arm spring against the stop brace and to push on the angled engagement feature;
   wherein the angled engagement feature is configured to push in a downward direction on the conductive surface to seal an enclosure opening of the removable component with the retractable EMC protection device.

2. The EMC protection apparatus of claim 1 wherein a portion of the retractable EMC protection device extends through the enclosure opening.

3. The EMC protection apparatus of claim 1, wherein the activation pin contacts the surface of the end product when the removable component is almost fully inserted.

4. The EMC protection apparatus of claim 1, wherein the EMC seal between the removable component and the end product is located proximate to an external surface of the end product.

5. The EMC protection apparatus of claim 1, wherein the retractable EMC protection device is an EMC gasket.

6. The EMC protection apparatus of claim 5 wherein the EMC gasket is bell shaped.

7. The EMC protection apparatus of claim 5 wherein the EMC gasket is configured to compressed between 30% and 70% of an original height of the EMC gasket.

8. The EMC protection apparatus of claim 1 wherein the retractable EMC protection device is an EMC spring.

9. The EMC protection apparatus of claim 1 wherein the retractable EMC protection device is an electrical noise absorber.

10. The EMC protection apparatus of claim 1 wherein the actuation pin is configured to engage upon a surface of an end product upon insertion of the removable component into the end product of upon insertion of at least 90% of the way into the end product.

11. A method of providing electromagnetic compatibility (EMC) protection comprising:
    inserting a removable component into an end product, the removable component including a retractable EMC protection apparatus;
    contacting, prior to completion of the inserting, a surface of the end product by an actuation pin of the retractable EMC protection apparatus;
    compressing an arm spring on an actuation arm following the contacting; and
    pushing on an angled engagement feature of the EMC protection feature by the actuation arm at the same time as the compressing, wherein the pushing causes an EMC protection device to seal an enclosure opening in the removable component.

12. The method of claim 11 wherein the EMC protection device is compressed in response to the pushing.

13. The method of claim 12 wherein the EMC protection device is compressed between 30% and 70% of an original height of the EMC protection device.

14. The method of claim 11 further comprising:
wiping the EMC protection device against the enclosure opening and an adjacent surface through the enclosure opening during the pushing.

15. The method of claim 11 wherein contacting occurs when the removable component is inserted at least 90% of the way into the end product.

16. A removable electronic component configured to be inserted into an end product comprising:
one or more enclosure openings;
one or more EMC protection apparatuses corresponding to one or more enclosure openings, the one or more EMC protection apparatuses comprising:
an actuation arm;
an actuation pin connected to a first end of the actuation arm;
an arm spring connected to the actuation pin;
a stop brace connected to the removable component, the actuation arm continuing through the strop brace, the stop brace configured to cause the arm spring to compress during insertion of the removable component;
a movable conductive surface;
an angled engagement feature on a first side of the movable conductive surface; and
a retractable EMC protection device connected to the movable conductive surface on a second side of the moveable conductive surface;
wherein the actuation pin is configured to engage upon a surface of an end product upon insertion of the removable component into the end product;
wherein the activation arm is configured to simultaneously compress the arm spring against the stop brace and to push on the angled engagement feature;
wherein the angled engagement feature is configured to push in a downward direction on the conductive surface to seal the enclosure opening with the retractable EMC protection device.

17. The removable component of claim 16 wherein the one or more retractable EMC protection apparatuses are disposed on one or more sides of the removable component.

18. The removable component of claim 16 wherein a portion of the retractable EMC protection device extends through the enclosure opening.

19. The removable component of claim 18, wherein the retractable EMC protection device is an EMC gasket.

20. The removable component of claim 19 wherein the EMC gasket is bell shaped.

* * * * *